United States Patent [19]
Larsson et al.

[11] Patent Number: 5,374,905
[45] Date of Patent: Dec. 20, 1994

[54] PHASE LOCKED LOOP MOTOR CONTROL CIRCUIT FOR TUNING CAVITY RESONATOR

[75] Inventors: Lennart Larsson, Åkersberga; Ulf Saldell, Österskär, both of Sweden

[73] Assignee: Allgon AB, Akersberga, Sweden

[21] Appl. No.: 87,764

[22] PCT Filed: Jan. 8, 1992

[86] PCT No.: PCT/SE92/00004
§ 371 Date: Jul. 9, 1993
§ 102(e) Date: Jul. 9, 1993

[87] PCT Pub. No.: WO90/06627
PCT Pub. Date: Jun. 14, 1990

[30] Foreign Application Priority Data
Jan. 9, 1991 [SE] Sweden .............. 9100065-3

[51] Int. Cl.$^5$ .................. H03L 7/06; H03J 7/16
[52] U.S. Cl. .................. 331/35; 455/123; 455/125
[58] Field of Search .............. 331/9, 13, 35; 333/232; 455/123, 124, 125; 334/16, 25

[56] References Cited
U.S. PATENT DOCUMENTS
3,271,684  9/1966  Simon .................. 325/175
4,992,745  2/1991  Hirota et al. .................. 328/235

FOREIGN PATENT DOCUMENTS
WO90/06627  6/1990  WIPO .

*Primary Examiner*—Siegfried H. Grimm
*Attorney, Agent, or Firm*—Jacobson, Price, Holman & Stern

[57] ABSTRACT

An arrangement in tuning resonance modules includes a cavity and resonance body, which is steered to resonance position by a motor, which is driven by a voltage as long as there is a phase difference between the input signal to the resonance module and the output signal (called the measuring signal) from the module. The input signal is of high frequency, and it is desired now to transpose the signals down to low frequency for preventing interference with the measuring signal. The arrangement therefore includes a high-frequency oscillator controlled by a voltage and having a frequency range within which lies the frequency of the incoming signal. From the oscillator output signal and the input signal there is formed in a mixing means the difference between the signals, and in a second mixing means there is formed the difference between the oscillator output signal and the measuring signal such as to form hereby two low-frequency signals. These are compared in a phase detector with respect to phase position. For a phase difference the detector gives a voltage, but for phase equality the detector gives zero voltage.

6 Claims, 2 Drawing Sheets

PHASE LOCKED LOOP MOTOR CONTROL CIRCUIT FOR TUNING CAVITY RESONATOR

The present invention relates to an arrangement in tuning resonance modules including a cavity and resonance body, which is steered to a resonance position by a motor driven by a voltage as long as there is a phase difference between the input signal to the resonance module and its output signal, called the measuring signal, the input signal being of high frequency.

It is known in the art to provide a plurality of resonance modules working with a cavity and a resonance means movable in the cavity. In such modules there is thus used a reference signal originating from the input signal and a measurement signal which is the output signal from the cavity. The resonance means adjusts itself so that these two signals are brought to the same phase, thereby causing resonance in the module. When the input signal is high-frequency, also making the reference and measuring signals high-frequency, it is desirable to transpose the signals down to low frequency, with the intention of enabling the use of standard electronic units in comparing the signal phase positions. In addition, there is the problem that a plurality of signals of different frequencies and amplitudes can be received with mutual interference in a resonance module, and it is therefore important that signals from one or more adjacent modules shall be prevented from entering the specific module. Also, there is always a certain amount of reflection from the input signal to the resonance module, and this must not be allowed to return and interfere with the reference signal taken off from the signal.

The above-mentioned problems are solved in the present invention by its having been given the distinguishing features disclosed in the accompanying claims.

A preferred embodiment of the invention will now be described,

Figure 1:
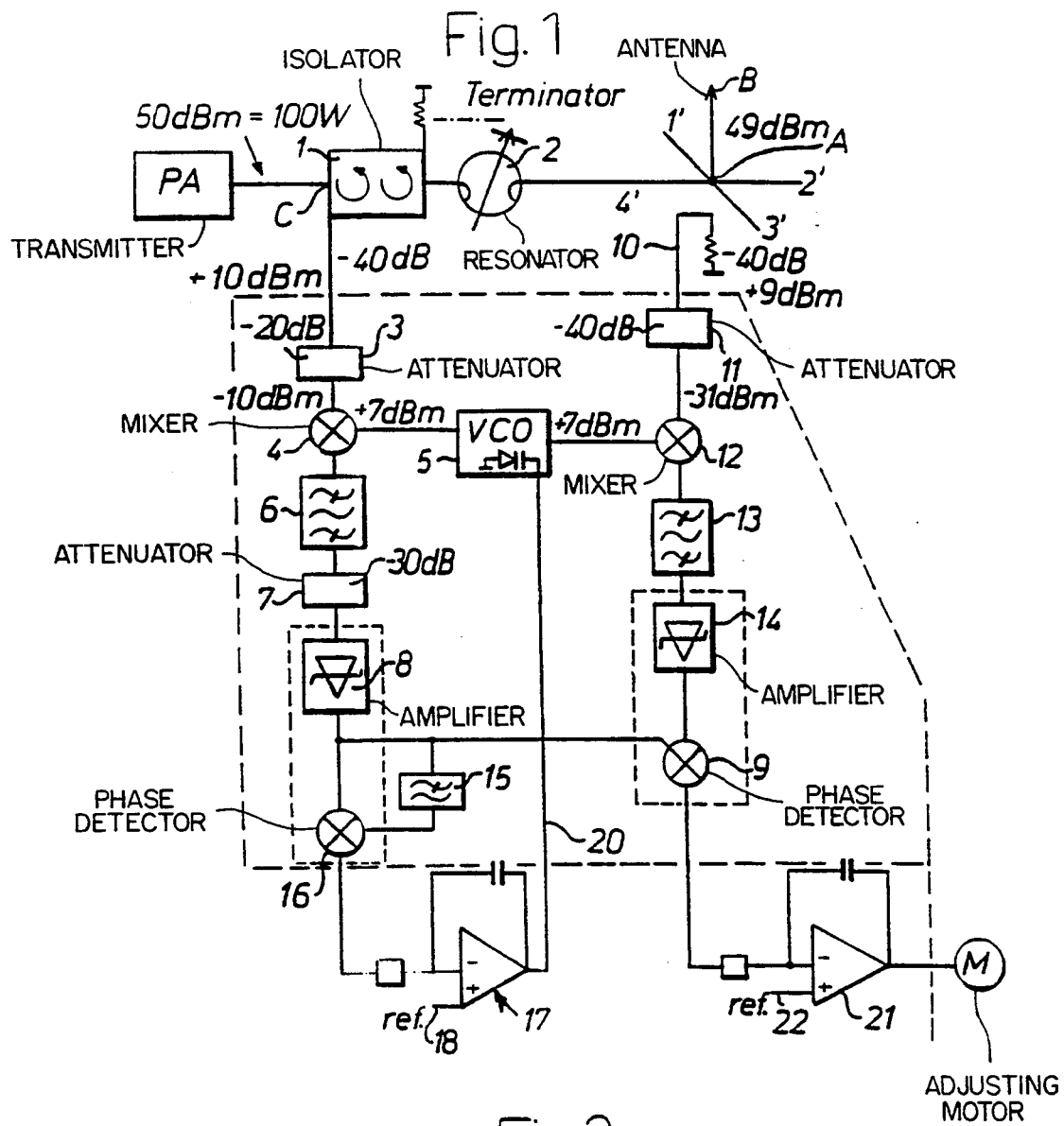
FIG. 1 is a circuit diagram in accordance with the invention.

The letter A denotes a collection point on an antenna, where four signals of different frequencies are collected for common transmission from the antenna B. A signal 4' is sent from the resonance module 2. A transmitter is denoted by the letters PA, and a signal from it goes to an isolator 1 and further to the resonance module 2. The latter is formed with a cavity accommodating a movable resonance means driven by a motor until resonance occurs between the reference signal and the signal (called the measuring signal) coming from the module. Since the latter does not form any part of the invention it is not described further.

The isolator 1 solely permits passage of signals in the mentioned direction, and prevents any signal reflected in the module, as well as signals from the collection point A and through the module from reaching the transmitter PA. A reference signal is taken from the input at a point C. In the path of the reference signal there is an attenuator 3 for adjusting the signal to a level suitable to a mixer 4. The signal thus arrives at the mixer, and this reference signal from the attenuator is then mixed with an output signal from an oscillator 5.

The mixer 4 gives one signal, which is the sum of the two input signals, and one which is the difference between the two signals. After the mixer there is a bandpass filter 6, which is formed for passing through the signal constituting the difference between the two input signals to the mixer 4. Consequently, if both the reference signal and the signal from the oscillator are of high frequency, but mutually close, the output signal from the mixer will be of low frequency and can pass through the bandpass filter 6. This can provide the lowest possible frequency, e.g. 20 to 220 kHz. These values should be viewed in relation to the frequency of the input signal from PA, which can be about 1000 MHz.

Figure 2:
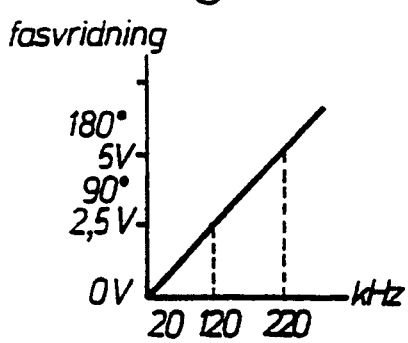
FIG. 2 is a graph illustrating the frequency as a function of phase angle.

After the bandpass filter there is an attenuator 7, and this, together with an amplifier 8, determines a power range suitable for the system. There is thus obtained after the attenuator 7 and limiting amplifier 8 an output signal with a constant amplitude, irrespective of the input amplitude, within a power range normal for the system. A phase detector 16 and a lowpass filter 15 together form a wideband frequency detector. An integrator circuit 17 compares the output voltage of the frequency detector 15,16 with a reference voltage at a point 18 in this circuit. The output signal of the integrator circuit is taken via a line 20 to the oscillator 5, so that the difference frequency in this case is given a mean value of 120 kHz (see FIG. 2), the reference voltage having been selected at 2.5 V.

The oscillator 5 is voltage controlled, so that a higher voltage gives a higher frequency and a lower voltage a lower frequency. For example the oscillator may have a sensitivity of 14 MHz per volt. Accordingly, when the frequency detector 16 has shifted the reference voltage 90 degrees, so that the output voltage will be equal to the reference voltage, this will mean that the voltage in the signal through the line 20 is constant, thus giving an output signal from the oscillator that is constant at a value somewhere between 90 MHz and 1000 MHz. When the attenuator then determines the difference between the signal coming from the oscillator and the reference signal, it will be understood that the output signal from the attenuator has a low frequency, which will be lower the nearer the oscillator frequency is to the reference signal frequency.

From the amplifier 8 a signal is also taken to a second phase detector 9, which compares the phase difference of the reference signal processed in the means 3–8 with a measuring signal coming from a directional coupler 10. For adjusting the signal to a suitable level, an attenuator 11, of the same kind as attenuator 3, is disposed in the line from the directional coupler. The signal from the attenuator goes to a second mixer 12, similar to the mixer 4, for further propagation of the difference between the signal from oscillator 5 and the signal from the attenuator 11. In total, there are four output signals with varying differences, due to the signals from 1', 2', 3' and 4' arriving. A bandpass filter 13 sorts out three of the signals from the mixer 12, and in this case the signal 4' is taken to the phase detector 9 via a limiting amplifier 14.

Figure 3:
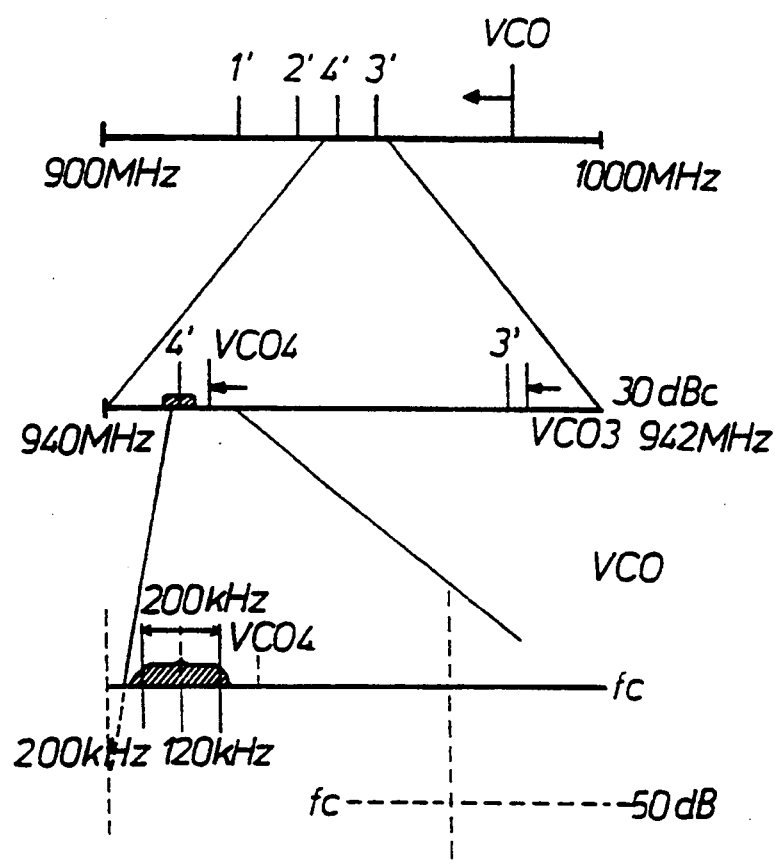
FIG. 3 is a graph illustrating the transposition of signal high frequency to low frequency for the same signal.

FIG. 3 illustrates the transposition of the transmitter frequency, including its modulation, e.g. from a value within the 900 MHz–1000 MHz range, to a mean value of about 120 kHz. It will be seen that in this case the oscillator sweeps from right to left (see the arrow vco), and that the signals 1', 2', 3' are filtered off in the bandpass filter 13, since their frequencies are far away from the frequency of 4', see the upper part of FIG. 3. It may thus be said that a "new" signal is obtained by forming the difference between the frequencies of the reference and oscillator signals, and this signal has a frequency that will be lower the less the difference is between the frequencies of the two signals just mentioned. This is illustrated by the middle frequency scale in FIG. 3, where the newly formed signal is situated, e.g. with a frequency range of 200 kHz (FIG. 3, bottom part).

The phase positions of the respective signals from the amplifiers 14 and 8 are compared by the phase detector 9. The latter gives an output voltage if there is a phase difference, and this voltage is compared with a reference voltage 22 in an integrator 21, the output voltage of which drives an adjusting motor M. It is this motor M that drives the unillustrated resonance body of the resonance module 2 to the position where resonance is obtained, i.e. when the difference between input and output signal to and from the module is zero.

The oscillator has been described hereinbefore as an important item in the invention, since it shall, with the aid of the mixer, give the low-frequency signal. It has also been described above how the oscillator is controlled by a voltage determined by the reference signal and a reference voltage. The oscillator voltage may be decided in another way, however. The reference signal could be taken directly from the transmitter, and via a modulating means it could be given a somewhat deviating frequency, which is allowed to decide the oscillator's corresponding frequency. Another method is to control the oscillator with the aid of a digital code from the transmitter, via a frequency synthesizing circuit.

We claim:

1. Arrangement in tuning resonance modules including a cavity and resonance body that is steered to a resonance position by a motor driven by a voltage, as long as there is a phase difference between an input signal of high frequency to the resonance module and an output signal therefrom, called the measuring signal, characterized in that the arrangement includes a high-frequency oscillator (5) controlled by a voltage and having a frequency range within which lies the frequency of said input signal; in that the difference between the output signal from the oscillator (5) and the input signal is formed in a mixing means (4); and in that a difference between the oscillator output signal and the measuring signal is formed in a second mixing means (12), two low-frequency signals thus being formed, these signals being compared in a phase detector (9) with respect to phase position, such that the detector (9) gives a voltage when there is a phase difference, but when there is phase equality it gives zero voltage.

2. Arrangement as claimed in claim 1, characterized in that the oscillator is controlled by a voltage generated by a signal, which has its frequency being the difference between the input signal frequency and the oscillator signal frequency, said signal causing an output voltage from a frequency detector (16), there being an integrator (17) for comparing this voltage with a reference voltage, so that when the difference is constant the oscillator remains at a given frequency.

3. Arrangement as claimed in claim 1, characterized in that the input signal to the resonance module passes through an isolator (1), which solely passes through signals in the direction towards the resonance module.

4. Arrangement as claimed in claim 1, characterized in that a bandpass filter (6) is arranged after the mixing means (4), and is disposed such as to permit passage of a signal having a low frequency in relation to the frequency of the reference signal.

5. Arrangement as claimed in claim 1, characterized in that a bandpass filter (13) is disposed after the second mixing means (12), such as to permit passage of a signal having very low frequency in relation to that of the measuring signals (1', 2', 3' and 4').

6. Arrangement as claimed in claim 1, characterized in that the oscillator is controlled by a digital code from a transmitter via a frequency synthesizing circuit, which transmits an adjusted voltage to the oscillator.

* * * * *